(12) United States Patent
Hagiya et al.

(10) Patent No.: US 8,072,358 B2
(45) Date of Patent: Dec. 6, 2011

(54) VARIABLE LENGTH DECODER, ENCODER, AND VARIABLE LENGTH DECODING METHOD

(75) Inventors: Taro Hagiya, Nerima (JP); Xuan Fu, Beijing (CN)

(73) Assignee: Fujitsu Limited, Kawasaki (JP)

( * ) Notice: Subject to any disclaimer, the term of this patent is extended or adjusted under 35 U.S.C. 154(b) by 148 days.

(21) Appl. No.: 12/533,436

(22) Filed: Jul. 31, 2009

(65) Prior Publication Data

US 2010/0039301 A1 Feb. 18, 2010

(30) Foreign Application Priority Data

Aug. 12, 2008 (JP) .................................. 2008-208208

(51) Int. Cl.
*H03M 7/40* (2006.01)
(52) U.S. Cl. ............. 341/67; 341/65; 341/106; 341/107
(58) Field of Classification Search .................... 341/65, 341/67, 106, 107
See application file for complete search history.

(56) References Cited

U.S. PATENT DOCUMENTS

| | | | | |
|---|---|---|---|---|
| 5,381,144 A * | 1/1995 | Wilson et al. | .................. | 341/63 |
| 5,539,401 A | 7/1996 | Kumaki et al. | | |
| 5,675,331 A * | 10/1997 | Watanabe et al. | ................ | 341/67 |
| 5,852,469 A * | 12/1998 | Nagai et al. | .............. | 375/240.23 |
| 5,969,650 A * | 10/1999 | Wilson | ..................... | 341/67 |
| 6,501,801 B2 * | 12/2002 | Chujoh et al. | ........... | 375/240.23 |
| 6,546,053 B1 * | 4/2003 | Ishii | ........................ | 375/240.27 |
| 6,587,057 B2 * | 7/2003 | Scheuermann | ................. | 341/67 |
| 6,674,376 B1 * | 1/2004 | Nishimura | ..................... | 341/67 |
| 6,696,993 B2 * | 2/2004 | Karczewicz | .................... | 341/67 |
| 6,704,361 B2 * | 3/2004 | Bublil et al. | ............. | 375/240.23 |
| 6,958,715 B2 * | 10/2005 | Zhou | .............................. | 341/67 |
| 7,129,862 B1 * | 10/2006 | Shirdhonkar et al. | .......... | 341/67 |
| 7,203,372 B1 * | 4/2007 | Chen et al. | .................... | 382/244 |
| 7,289,047 B2 * | 10/2007 | Nagori | ............................ | 341/67 |
| 7,292,163 B1 * | 11/2007 | Fedele | ............................ | 341/67 |
| 7,385,534 B2 * | 6/2008 | Pearlstein et al. | .............. | 341/59 |
| 7,471,840 B2 * | 12/2008 | Toebes et al. | ................. | 382/245 |

FOREIGN PATENT DOCUMENTS

| | | |
|---|---|---|
| JP | 8-79091 A | 3/1996 |
| JP | 10-022835 A | 1/1998 |

\* cited by examiner

*Primary Examiner* — Linh V Nguyen
(74) *Attorney, Agent, or Firm* — Arent Fox, LLP

(57) ABSTRACT

A variable length decoder that decodes a variable length code to output data including a run and a level, the variable length decoder includes a memory that stores an output format of a run and a level according to a prefix for specifying an area which is generated by dividing a run-level plane based on the run; a extraction circuit that extracts the prefix, run computation data, and level computation data from the variable length code; and an output circuit that accesses the memory based on the prefix and outputs the data based on the run computation data and the level computation data.

15 Claims, 25 Drawing Sheets

| CONDITION | COMPUTATION OF pRN | COMPUTATION OF pLV | ADDRESS (CONVERSION RESULT) |
|---|---|---|---|
| if (LEVEL=1) | pRN = RUN | – | {11, pRN[4:0]} |
| else if (RUN=0 && LEVEL<= 33) | – | pLV = LEVEL - 2 | {00, pLV[4:0]} |
| else if (RUN=0) | – | pLV = LEVEL - 34 | {0100 pLV[2:0]} |
| else if (LEVEL=2) | pRN = RUN - 1 | – | {101, pRN[3:0]} |
| else if (RUN=1) | – | pLV = LEVEL - 3 | {011, pLV[3:0]} |
| eles if (RUN<=3) | pRN = RUN - 2 | pLV = LEVEL - 3 | {0101, pRN[0], pLV[1:0]} |
| else | pRN = RUN - 4 | – | {10000, pRN[1:0]} |

FIG. 1

| Bit STRING | RUN | LEVEL |
|---|---|---|
| 10 | EOB | |
| 11 | 0 | 1 |
| 011 | 1 | 1 |
| 0100 | 0 | 2 |
| 0101 | 2 | 1 |
| 00101 | 0 | 3 |
| 00111 | 3 | 1 |
| 00110 | 4 | 1 |
| 000110 | 1 | 2 |
| 00111 | 5 | 1 |
| 000101 | 6 | 1 |
| 000100 | 7 | 1 |
| 0000110 | 0 | 4 |
| 0000100 | 2 | 2 |
| : | : | : |

5bit                    6bit

FIG. 7

| PREFIX (2) | | | |
|---|---|---|---|
| 00 | x | R(5) | L(1) |
| 01 | R(5) | | L(2) |
| 10 | x | R(3) | L(3) |
| 11 | R(1) | L(6) | |

R : BITS FOR STORING RUN
L : BITS FOR STORING LEVEL
x : UNUSED BITS     ( ) INDICATES BIT WIDTH

Level = $-1 \sim +1$
Level = $-2, +2$
Level = $-6 \sim -3, +3 \sim +6$
Level = $-40 \sim -7, +7 \sim +40$

FIG. 8

| Level RANGE | −1~+1 | −2, +2 | −6~−3, +3~+6 | ETC. |
|---|---|---|---|---|
| Run RANGE IN Level RANGE | 0~31 | 0~16 | 0~6 | 0, 1 |
| REQUIRED BIT NUMBER — Level | 1 | 2 | 3 | 6 |
| REQUIRED BIT NUMBER — Run | 5 | 5 | 3 | 1 |

FIG. 10

| CONDITION | COMPUTATION OF pRN | COMPUTATION OF pLV | ADDRESS (CONVERSION RESULT) |
|---|---|---|---|
| if (LEVEL=1) | pRN = RUN | — | {11, pRN[4:0]} |
| else if (RUN=0 && LEVEL<=33) | — | pLV = LEVEL − 2 | {00, pLV[4:0]} |
| else if (RUN=0) | — | pLV = LEVEL − 34 | {0100, pLV[2:0]} |
| else if (LEVEL=2) | pRN = RUN − 1 | — | {101, pRN[3:0]} |
| else if (RUN=1) | — | pLV = LEVEL − 3 | {011, pLV[3:0]} |
| eles if (RUN<=3) | pRN = RUN − 2 | pLV = LEVEL − 3 | {0101, pRN[0], pLV[1:0]} |
| else | pRN = RUN − 4 | — | {10000, pRN[1:0]} |

FIG. 11

| CONDITION | INTERPRETATION OF INPUT DATA | RUN CALCULATION METHOD | LEVEL CALCULATION METHOD |
|---|---|---|---|
| if (prefix = '00') | {00, pLV[4:0]} | RUN = 0 | LEVEL = pLV[5:0] + 2 |
| if (prefix = '0100') | {0100, pLV[2:0]} | RUN = 1 | LEVEL = pLV[2:0] + 34 |
| if (prefix = '011') | {011, pLV[3:0]} | RUN = 1 | LEVEL = pLV[3:0] + 3 |
| if (prefix = '0101') | {0101, pRN[0], pLV[1:0]} | RUN = pRN[0] + 2 | LEVEL = pLV[1:0] + 3 |
| if (prefix = '10000') | {10000, pRN[1:0]} | RUN = pRN[1:0] + 4 | LEVEL = 3 |
| if (prefix = '101') | {101, pRN[3:0]} | RUN = pRN[3:0] + 1 | LEVEL = 2 |
| if (prefix = '11') | {11, pRN[4:0]} | RUN = pRN[5:0] | LEVEL = 1 |

FIG. 14

| CONDITION | COMPUTATION OF pRN | COMPUTATION OF pLV | ADDRESS (CONVERSION RESULT) |
|---|---|---|---|
| if (RUN==0) | – | pLV = LEVEL – 1 | {00, pLV[5:0]} |
| if (RUN==1) | – | pLV = LEVEL – 1 | {010, pLV[4:0]} |
| if (2<=RUN && RUN<=3) | pRN = RUN – 2 | pLV = LEVEL – 1 | {011, pRN[0], pLV[3:0]} |
| if (4<=RUN && RUN<=5) | pRN = RUN – 4 | pLV = LEVEL – 1 | {1000, pRN[0], pLV[2:0]} |
| if (6<=RUN && RUN<=9) | pRN = RUN – 6 | pLV = LEVEL – 1 | {1001, pRN[1:0], pLV[1:0]} |
| if (10<=RUN && RUN<=17) | pRN = RUN – 10 | pLV = LEVEL – 1 | {101, pRN[2:0], pLV[1:0]} |
| if (18<=RUN) | pRN = RUN – 18 | pLV = LEVEL – 1 | {11, pRN[4:0], pLV[0]} |

FIG. 15

| CONDITION | INTERPRETATION OF INPUT DATA | RUN CALCULATION METHOD | LEVEL CALCULATION METHOD |
|---|---|---|---|
| if (prefix = '00') | {00, pLV[5:0]} | RUN = 0 | LEVEL = pLV[5:0] + 1 |
| if (prefix = '010') | {010, pLV[4:0]} | RUN = 1 | LEVEL = pLV[4:0] + 1 |
| if (prefix = '011') | {011, pRN[0], pLV[3:0]} | RUN = pRN[4] + 2 | LEVEL = pLV[3:0] + 1 |
| if (prefix = '1000') | {1000, pRN[0], pLV[2:0]} | RUN = pRN[3] + 4 | LEVEL = pLV[2:0] + 1 |
| if (prefix = '1001') | {1001, pRN[:0], pLV[1:0]} | RUN = pRN[3:2] + 6 | LEVEL = pLV[1:0] + 1 |
| if (prefix = '101') | {101, pRN[2:0], pLV[1:0]} | RUN = pRN[4:2] + 10 | LEVEL = pLV[1:0] + 1 |
| if (prefix = '11') | {11, pRN[4:0], pLV[0]} | RUN = pRN[5:1] + 18 | LEVEL = pLV[0] + 1 |

VARIABLE LENGTH DECODER, ENCODER, AND VARIABLE LENGTH DECODING METHOD

CROSS-REFERENCE TO RELATED APPLICATIONS

This application claims the benefit of priority from Japanese Patent Application No. 2008-208208 filed on Aug. 12, 2008, the entire contents of which are incorporated herein by reference.

BACKGROUND

1. Field

The embodiments described herein relate to a variable length decoder that decodes a variable length code.

2. Description of Related Art

A moving image encoding system such as MPEG employs Variable Length Code (VLC). In the VLC, a coefficient of a prediction error is orthogonally transformed, quantized, subjected to a zigzag scan, and converted to a run-level set. A variable length code is assigned to the obtained run-level set. A short code is assigned to a run-level set which occurs frequently, and a long code is assigned to a run-level which occurs less frequently. As a result, the entire code length becomes shorter. The run-level set is obtained from the variable length code during decoding.

A moving image encoding system employing the VLC is disclosed, for example, in Japanese Laid-open Patent Publication No. H8-79091 and Japanese Laid-open Patent Publication No. H10-22835.

SUMMARY

According to one aspect of embodiments, a variable length decoder that decodes a variable length code to output data includes a run and a level, the variable length decoder includes a memory that stores an output format of a run and a level according to a prefix for specifying an area which is generated by dividing a run-level plane based on the run; a extraction circuit that extracts the prefix, run computation data, and level computation data from the variable length code; and an output circuit that accesses the memory based on the prefix and outputs the data based on the run computation data and the level computation data.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 1 illustrates an exemplary variable length code;

FIG. 7 illustrates an exemplary classification of a level;

FIG. 8 illustrates an exemplary level range;

FIG. 10 illustrates a first embodiment;

FIG. 11 illustrates a first embodiment;

FIG. 14 illustrates a second embodiment;

FIG. 15 illustrates a second embodiment;

DESCRIPTION OF EMBODIMENTS

FIG. 1 illustrates an exemplary variable length code of a coefficient of MPEG-2. In FIG. 1, a run value and a level value are associated in a bit string of a bit stream. For example, five bits may be assigned to the run, and six bits may be assigned to the level.

Figure 2:
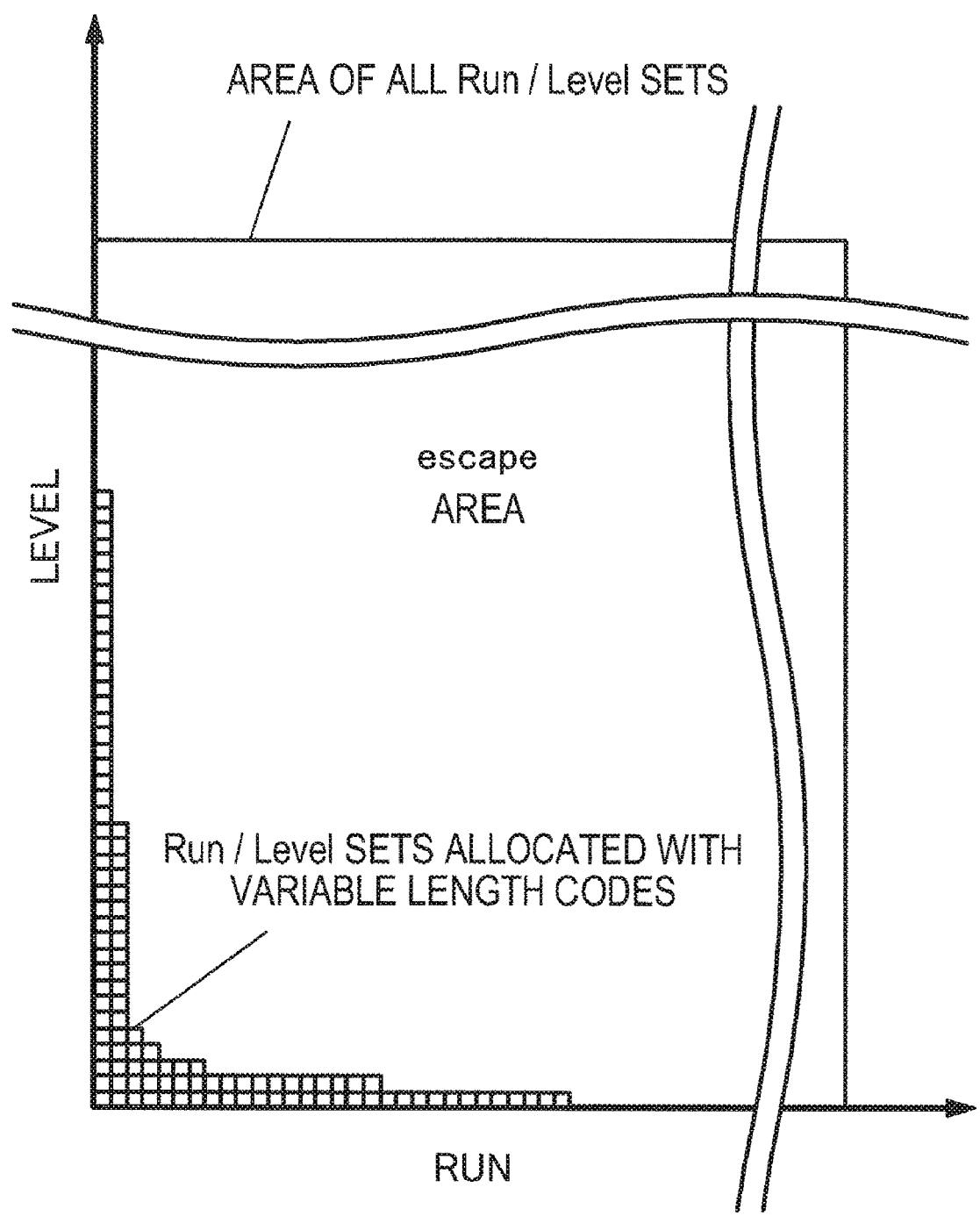
FIG. 2 illustrates an exemplary run-level set subjected to an escape process.

The variable length code is not assigned to the run-level set having a low occurrence rate, but is encoded by a separately defined escape process. FIG. 2 illustrates an exemplary run-level set subjected to the escape process.

Image data is converted to a motion vector and an error signal in image encoding. The error signal is orthogonally transformed into a coefficient of a frequency domain. A zigzag scan is performed on a two-dimensional surface of the frequency domain in the coefficient encoding, and a one-dimensional serial coefficient sequence is generated. A coefficient value is set as a level, and a distance from a coefficient that is not 0 to the next coefficient that is not 0 is set as a run to generate a run-level set and to encode a serial coefficient sequence. The serialized coefficient sequence includes a lot of low frequency components, and a high frequency components of the serialized coefficient sequence may be almost 0. Thus, the level is higher and the run is smaller with a lower frequency component. The level is lower and the run is larger with a higher frequency component. The run-level set assigned with a variable length code in FIG. 2 may possess this characteristic.

Figure 3:
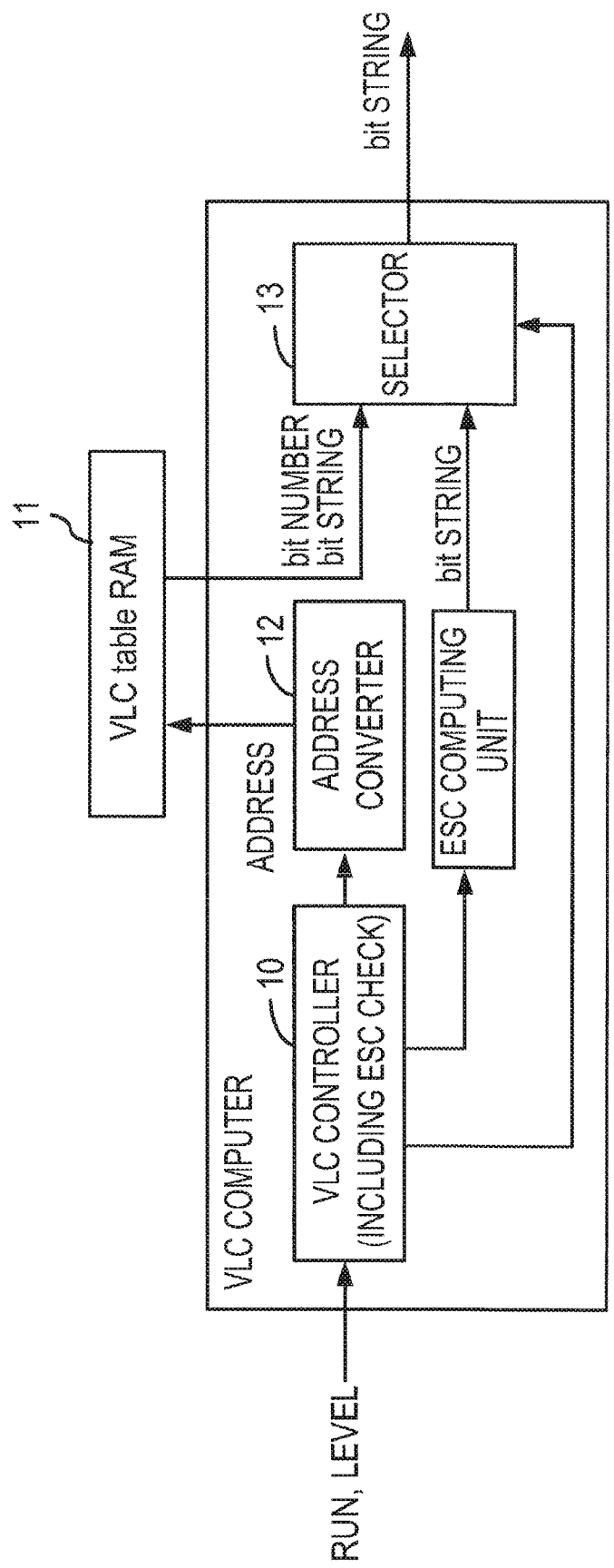
FIG. 3 illustrates an exemplary variable length encoder.

FIG. 3 illustrates an exemplary variable length encoder. A VLC controller 10 checks (escape check) whether an input run-level set exists in a variable length code table defined by a standard or not. If a run-level set exists in the variable length code table, an address converter 12 converts the run-level set to an address. A VLC table RAM 11 makes an access based on the address to output a bit string and a bit number. If the run-level set does not exist in the variable length code table, the bit string is obtained by an escape process. A selector 13 outputs either a bit string subjected to the escape process or the bit string and the bit number output from the table.

Figure 4:
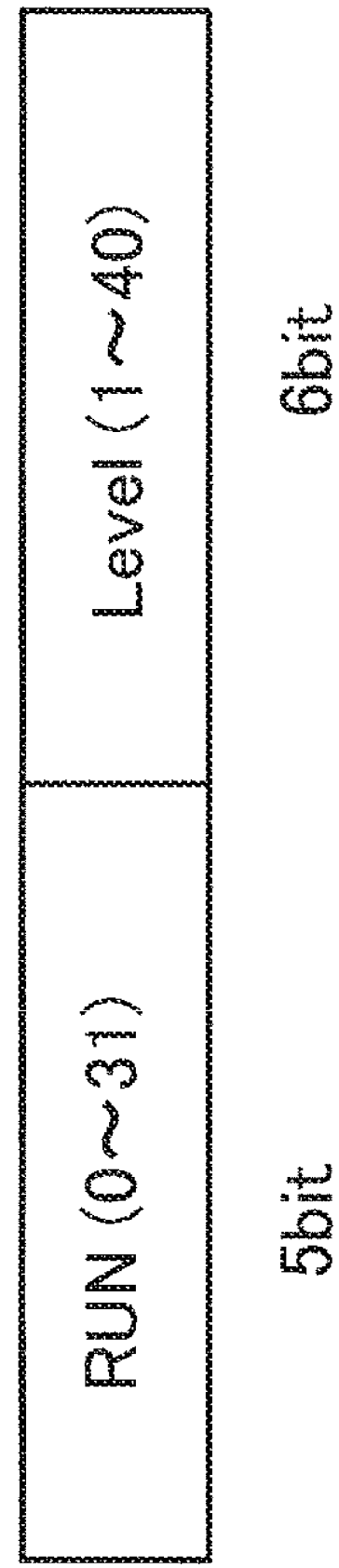
FIG. 4 illustrates an exemplary address.

The maximum value of the run is 5 bits and the maximum value of the level is 6 bits in the table of the variable length code illustrated in FIG. 1. For example, an apparatus couples the bits of simple run and level to output an address illustrated in FIG. 4. The address of the VLC table RAM may be 11 bits. An apparatus includes, for example, $2^{11}=2048$ words as an address of the RAM.

Figure 5:
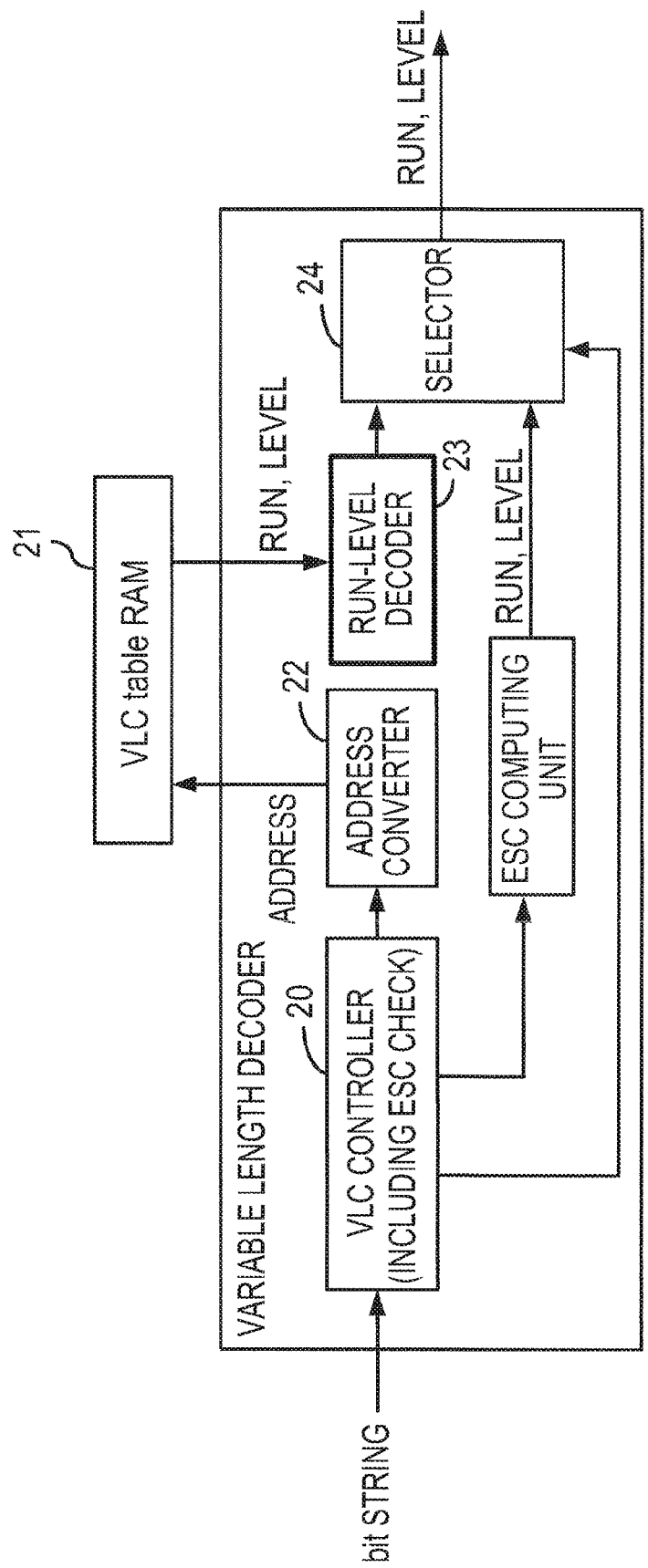
FIG. 5 illustrates an exemplary variable length decoder.
Figure 6:
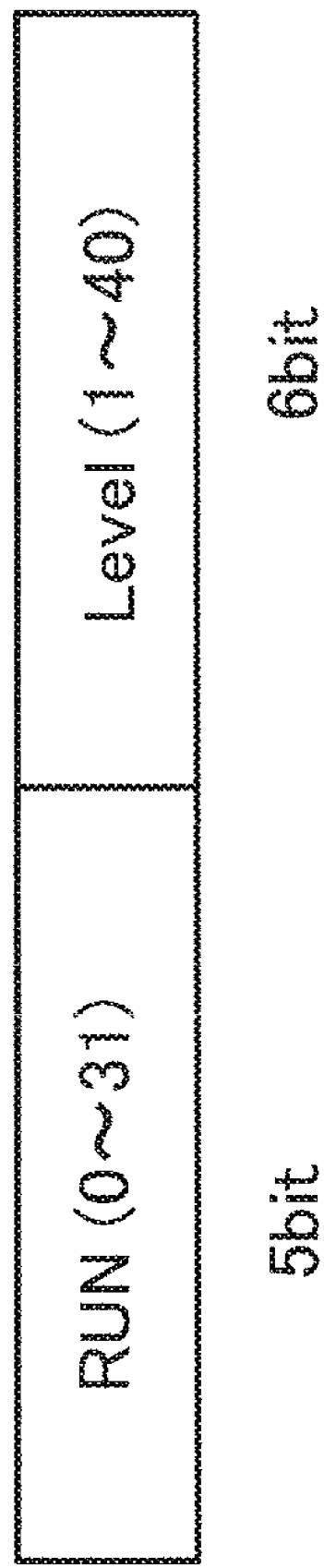
FIG. 6 illustrates an exemplary run-level set.

FIG. 5 illustrates an exemplary variable length decoder. A VLC controller 20 applies an escape check to an input bit string. When the bit string does not exist in the variable length code table, the escape process is applied to the bit string. If the bit string exists in the variable length code table, data is read from a VLC table RAM 21 based on an address obtained by an address converter 22. A run-level decoder 23 converts the read data to a run-level set and outputs the set. The selector 24 outputs one of a run-level set and an escape process result based on the result of the escape check. The bit width of the data held in the VLC table RAM 21 may be obtained as a sum of the bit widths for expressing the run-level set, and the width may be, for example, 11 bits. An example of the run-level set is illustrated in FIG. 6.

FIG. 7 illustrates an exemplary classification of a level. Areas illustrated with x of FIG. 7 indicate unused areas, R indicates bits for storing the run, and L indicates bits for storing the level. The bit string includes two-bit prefixes.

FIG. 8 illustrates an exemplary level range. In FIG. 8, a run-level set which was assigned a variable length code is classified by level range. For example, if the level range is −6 to −3 or +3 to +6, the necessary bit width for expressing the level in this range may be 4 and the necessary bit width for expressing the run which may be appear with the level in this range may be 3.

Although the address bit width of the VLC table RAM is reduced from 11 bits to 9 bits, further reduction of the bit width is desirable.

Figure 9:
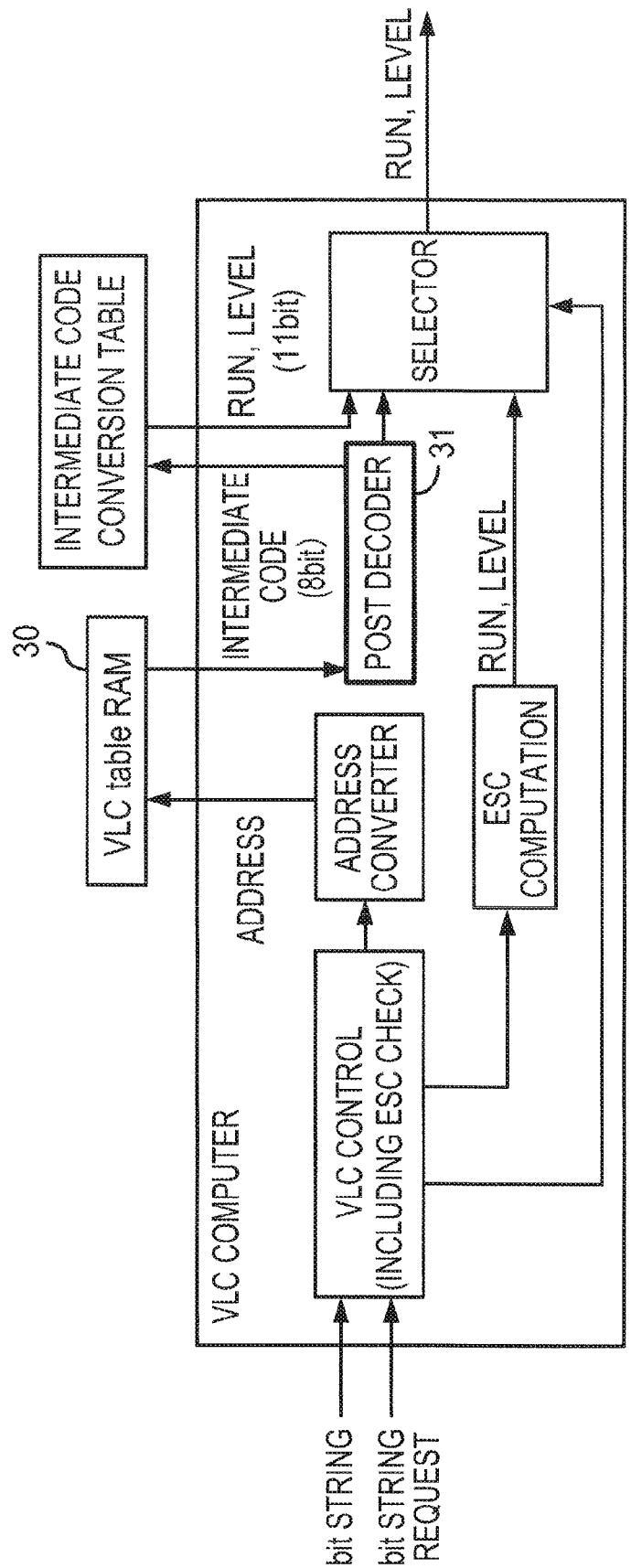
FIG. 9 illustrates another exemplary variable length code.

FIG. 9 illustrates another exemplary variable length code. A VLC table RAM 30 includes an intermediate code. A post decoder 31 uses an intermediate code conversion table for combinations of the run and the level greater than a certain value to calculate the run and the level. The variable length code of FIG. 9 may include two RAMs. However, the number of RAMs may be reduced.

A variable length encoder of an aspect of the embodiments may be configured substantially the same or similar to the configuration of the variable length encoder illustrated in FIG. 3. For example, the address converter receives a run-level set and outputs an address. A prefix part, a run part, a level part, and a sign part are bit-coupled in the address. The prefix part is uniquely set corresponding to each of the run-level groups for classifying the run-level sets included in the variable length code table. The address converter determines which run-level group the input run-level set belongs, and determines a corresponding prefix part. The sign bit of the level of the input run-level set corresponds to the sign part. The absolute value of the level of the run-level set corresponds to the level part. For example, the maximum value of the run of the run-level group is defined as m, and the minimum value is defined as n. The minimum bit length of the run part for providing the bit display to each of (m−n) binary numbers is defined as 1. For example, if the input run is r, a 1-bit binary expression corresponding to (r−n) corresponds to the run part. The level part may be determined similarly to the run part based on the absolute value of the level of the run-level set. The bit length of the address is the maximum value of each of the run-level groups (prefix bit length+run part bit length+level part bit length+sign part bit length).

FIGS. 10 and 11 illustrate a first embodiment. FIG. 10 illustrates an exemplary address conversion in a variable length encoder of MPEG-1/2. FIG. 11 illustrates an exemplary run-level decoding in a decoder.

The embodiment is applied to image compression in MPEG-1, MPEG-2, MPEG-4, VC-1, and so forth.

The configuration of the variable length decoder of the first embodiment is substantially the same or similar to the configuration of the variable length decoder illustrated in FIG. 5. The run-level decoder converts data, for example a bit string, read from the VLC Table RAM into a run-level set. A prefix part, a run part, a level part, and a sign part are bit-coupled in the bit string input to the run-level decoder. The prefix part is uniquely set to each of the run-level groups, in which the run-level sets stored in the variable length code table are classified. The run-level decoder checks the run-level group that the bit string belongs to based on the prefix part and extracts the run part, the level part, and the sign part. For example, the maximum value of the run of the run-level group is defined as m, and the minimum value is defined as n. The bit length of the run part is defined as a minimum bit length l for providing the bit display to each of (m−n) binary numbers. The run-level decoder interprets r in the bit string corresponding to the run part as a l-bit binary expression and calculates the run as (r+n). The absolute value of the level is calculated from the bit string corresponding to the level part. The bit corresponding to the sign part becomes a sign bit of the level. The bit length of the input bit string is the maximum value of each of the run-level groups (prefix bit length+run part bit length+level bit length+sign part bit length).

The minimum bit width is used in the first embodiment to identify run-level information of the prefix corresponding to a certain run-level group. The address bit width is reduced in the VLC Table RAM of the encoder. The data bit width is reduced in the VLC Table RAM of the decoder.

The run part or the level part may be reduced if, for example, the run-level group corresponding to a certain prefix includes one type of run or one type of level.

According to the first embodiment, the classification is made in the level direction and in the run direction. In FIG. 10, the run-level plane is classified both in the run direction and the level direction, such as, "level is 1" (classification 1), "not classification 1, run is 0, level is 33 or less" (classification 2), "neither classification 1 nor classification 2, run is 0" (classification 3), "not classification 1, classification 2, or classification 3, and level is 2" (classification 4), "not classification 1, classification 2, classification 3, or classification 4, and run is 1" (classification 5), "not classification 1, classification 2, classification 3, classification 4, or classification 5, run is 3 or less (classification 6), and "other cases". The calculation method of the run, the calculation method of the level, and the address conversion result are illustrated in each case.

The classification is based on the bit string corresponding to the prefix in FIG. 11. The bit string corresponding to the prefix indicates an area in a unique run-level plane. The interpreting method of input data and the calculation method of the run and the level differ depending on the bit string corresponding to the prefix.

Figure 12:
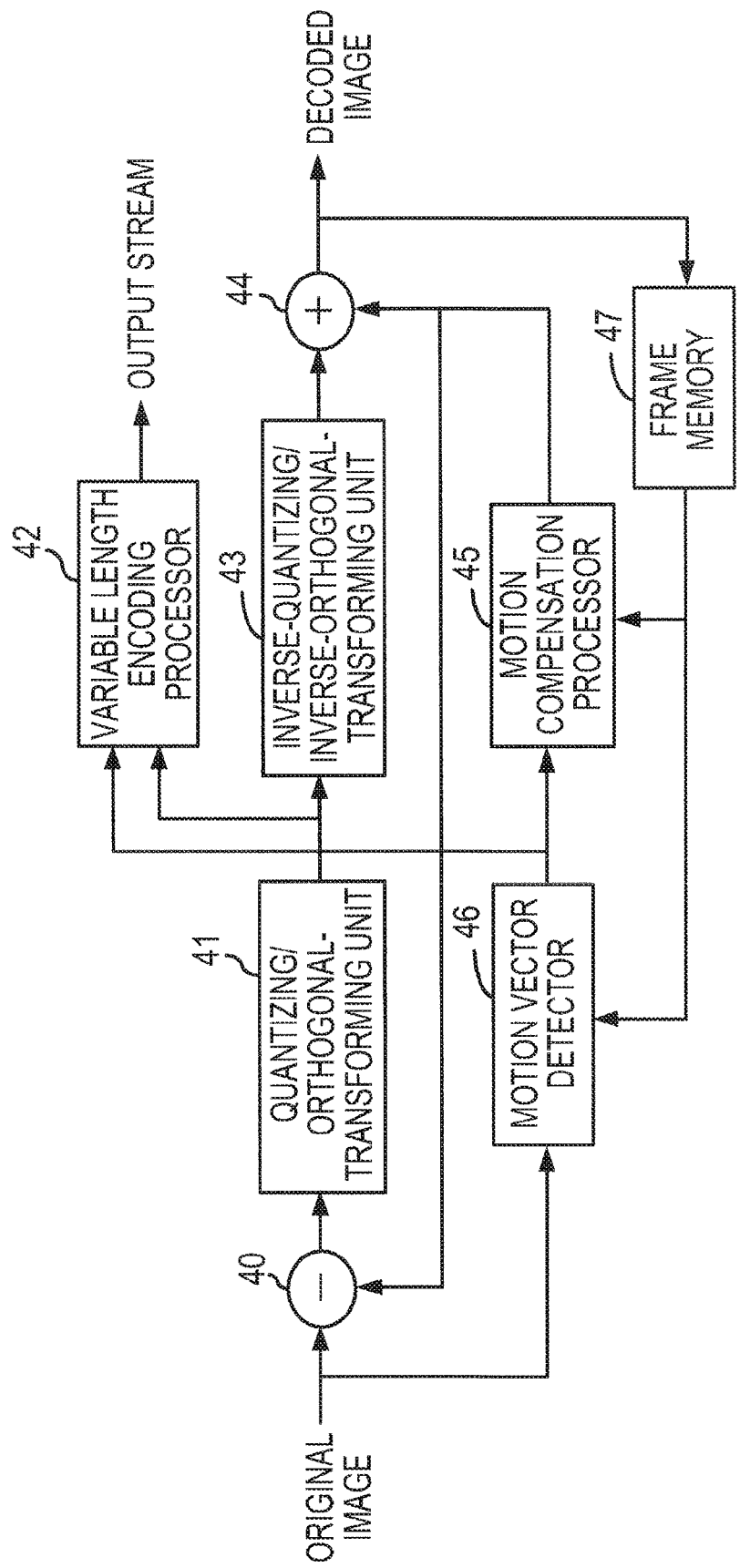
FIG. 12 illustrates an exemplary image encoder.
Figure 13:
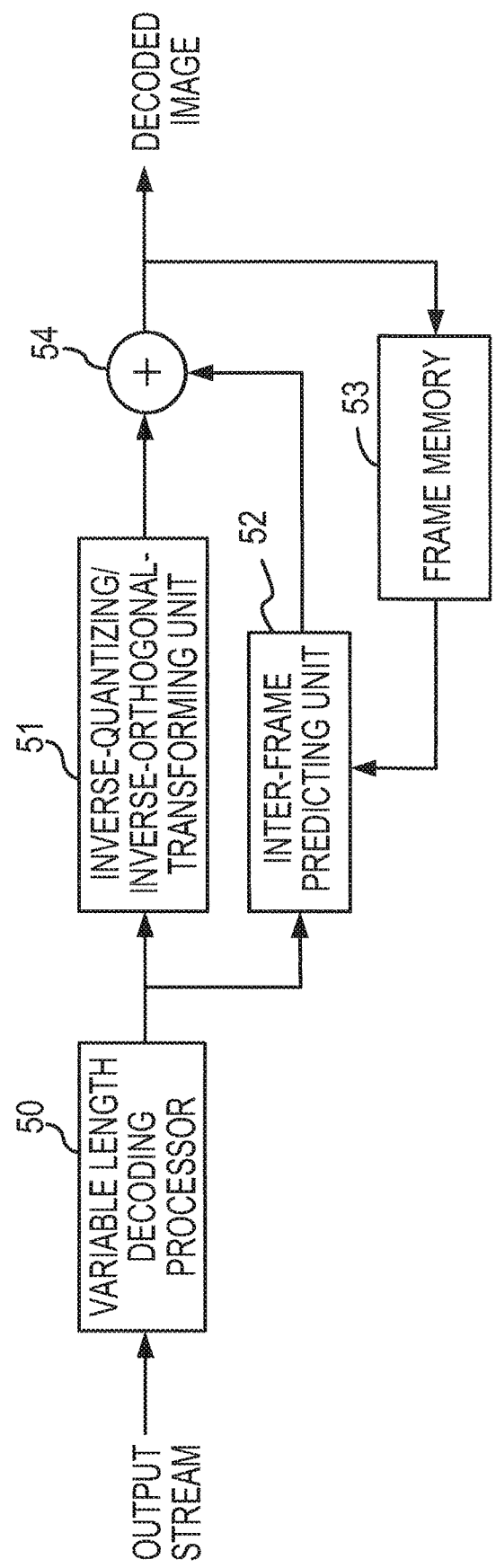
FIG. 13 illustrates an exemplary image decoder.

A set of the run and the level is indicated with a small bit number. Since the information of the run and the level is held, the original image is decoded. FIG. 12 illustrates an exemplary image encoder compliant with MPEG-1 and MPEG-2. FIG. 13 illustrates an exemplary image decoder compliant with MPEG-1 and MPEG-2.

An original image is input to a subtractor 40 in the image encoder of FIG. 12. A motion vector detector 46 and a motion compensation processor 45 generate a prediction image based on the original image. The subtractor 40 subtracts the prediction image from the original image to generate difference data. A quantizing/orthogonal-transforming unit 41 converts the difference data into coefficient data. A variable length encoding processor 42 converts the coefficient data into a variable length code and outputs an output stream. An inverse-quantizing/inverse-orthogonal-transforming unit 43 converts the output of the quantizing/orthogonal-transforming unit 41 back to the difference data of the spatial domain. An adder 44 adds the difference data of the spatial domain and the prediction image and outputs a decoded image. The decoded image is input to the frame memory 47 and input to a motion vector detector 46 and a motion compensation processor 45. The motion vector detector 46 and the motion compensation processor 45 generate a prediction image based on the original image and the decoded image.

In an image decoder of FIG. 13, a variable length decoding processor 50 converts an input stream into data such as a coefficient. An inverse-quantizing/inverse-orthogonal-transforming unit 51 converts the data such as a coefficient into data of a spatial domain. The output of the variable length decoding processor 50 is input to an inter-frame predicting unit 52. The inter-frame predicting unit 52 generates a prediction image based on the output of the variable length decoding processor 50 and the decoded image stored in the frame memory 53. An adder 54 adds the output of the inverse-quantizing/inverse-orthogonal-transforming unit 51 and the prediction image to generate a decoded image.

FIG. 14 illustrates a second embodiment. FIG. 14 illustrates an exemplary address conversion in a variable length encoder compliant with a plurality of standards such as MPEG-1/2/4 and VC-1. FIG. 15 illustrates an exemplary run-level decoding in the variable length decoder compliant with a plurality of standards such as MPEG-1/2/4 and VC-1.

The distribution of the assignment of the variable length codes to the run-level sets in moving image encoding is substantially similar to the distribution illustrated in FIG. 2. Therefore, the embodiment may be applied to a variable length encoder or a decoder compliant with a plurality of moving image encoding systems. The encoder and decoder may deal with various coding standards with varied content of the VLC Table RAM.

In FIG. 14, the conditions are classified into, for example, run is 0, run is 1, run is 2 or more and 3 or less, run is 4 or more and 5 or less, run is 6 or more and 9 or less, run is 10 or more and 17 or less, and run is 18 or more. In the classifications, the calculation methods of the runs are different, but the calculation methods of the levels are substantially the same. The example illustrated in FIG. 15 includes seven prefixes, corresponding to FIG. 14. The calculation methods of the prefixes and the runs are different. The bit numbers of the level values are different, but the calculation methods of the levels are substantially the same.

Figure 16:
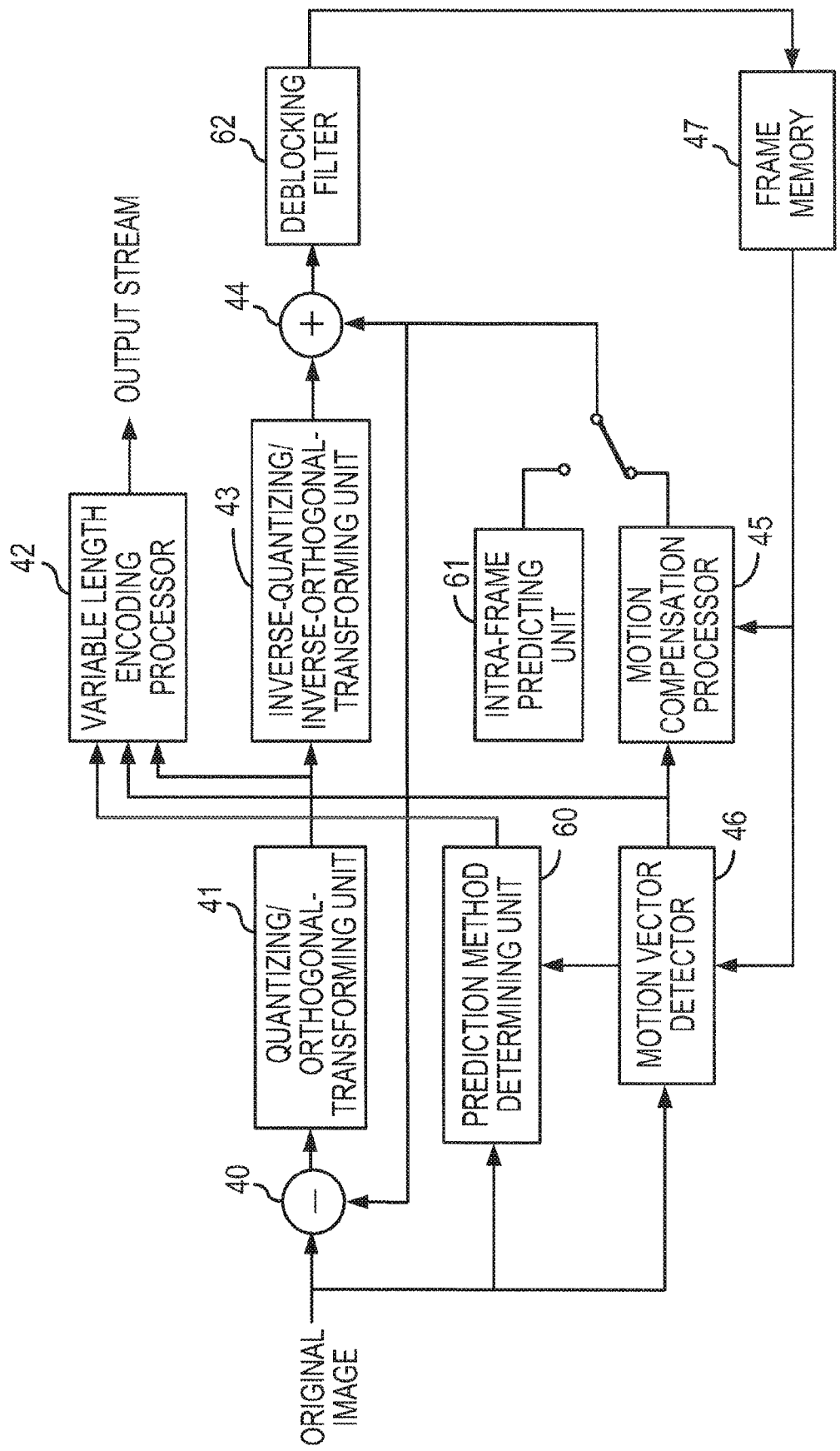
FIG. 16 illustrates an exemplary variable length encoder.
Figure 17:
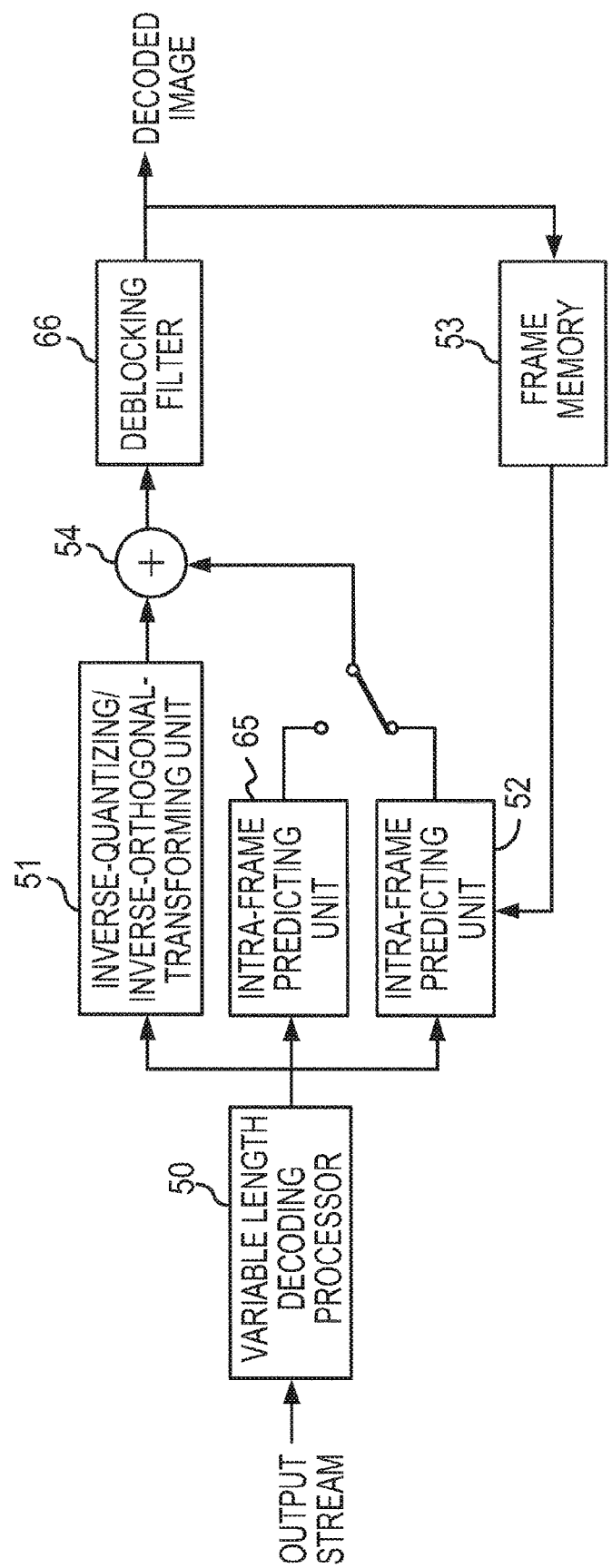
FIG. 17 illustrates an exemplary variable length decoder.

FIG. 16 illustrates an exemplary image encoder compliant with VC-1 or an image encoder compliant with MPEG-1/2/4 and VC-1. FIG. 17 illustrates an exemplary image decoder compliant with VC-1 or an image decoder compliant with MPEG-1/2/4 and VC-1.

In FIGS. 16 and 17, the same elements as illustrated in FIG. 12 or 13 are designated with the same reference numerals, and the description is omitted or reduced.

The image encoder illustrated in FIG. 16 includes a prediction method determining unit 60, an intra-frame predicting unit 61, and a deblocking filter 62. Other elements are substantially the same as or similar to the image encoder illustrated in FIG. 12. The intra-frame predicting unit 61 refers to the image in the same frame to generate a prediction image. Based on the information of the motion vector, the prediction method determining unit 60 selects either the motion compensation processor 45 that performs inter-frame prediction or the intra-frame predicting unit 61 that performs intra-frame prediction. The prediction is made based on the image quality of a compound image. The deblocking filter 62 filters the borders between the blocks (image is decoded block by block) to obscure the block noise included in the decoded image.

The image decoder of FIG. 17 includes an intra-frame predicting unit 65 and a deblocking filter 66. Other elements are substantially the same as or similar to the image decoder illustrated in FIG. 13. The intra-frame predicting unit 65 performs intra-frame prediction to generate a prediction image. The deblocking filter 66 filters around the decoding blocks of the decoded image.

Figure 18:
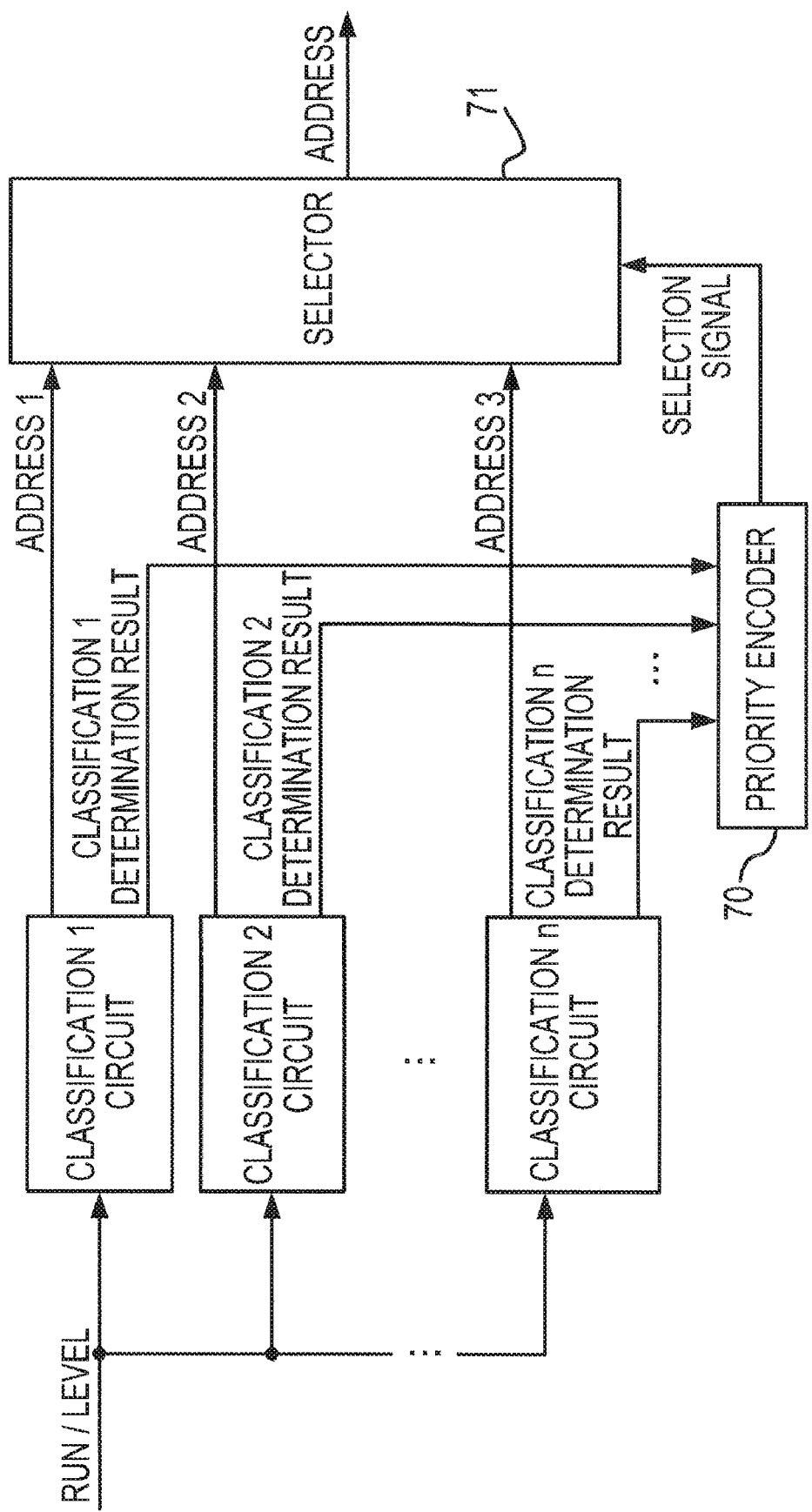
FIG. 18 illustrates an exemplary address converter.

FIG. 18 illustrates an exemplary address converter of a image encoder. Each classification m circuit (m is an arbitrary integer from 1 to n) outputs a determination result indicating whether a run-level belongs to the classification and a result of conversion from the run-level in the classification to an address. The number n of the classification m circuits is based on a number of classifications of run/level sets. A priority encoder 70 selects a classification with the highest priority among the classifications satisfying the conditions and outputs the classification to a selector 71 as a selection signal. The selector 71 selects an address based on the selection signal. The priority order of the priority encoder 70 may be, for example, 1, 2, . . . , and n.

The run-level set input to the address converter belongs to, for example, one of the classifications. Therefore, the address selects the selector 71.

Figure 19:
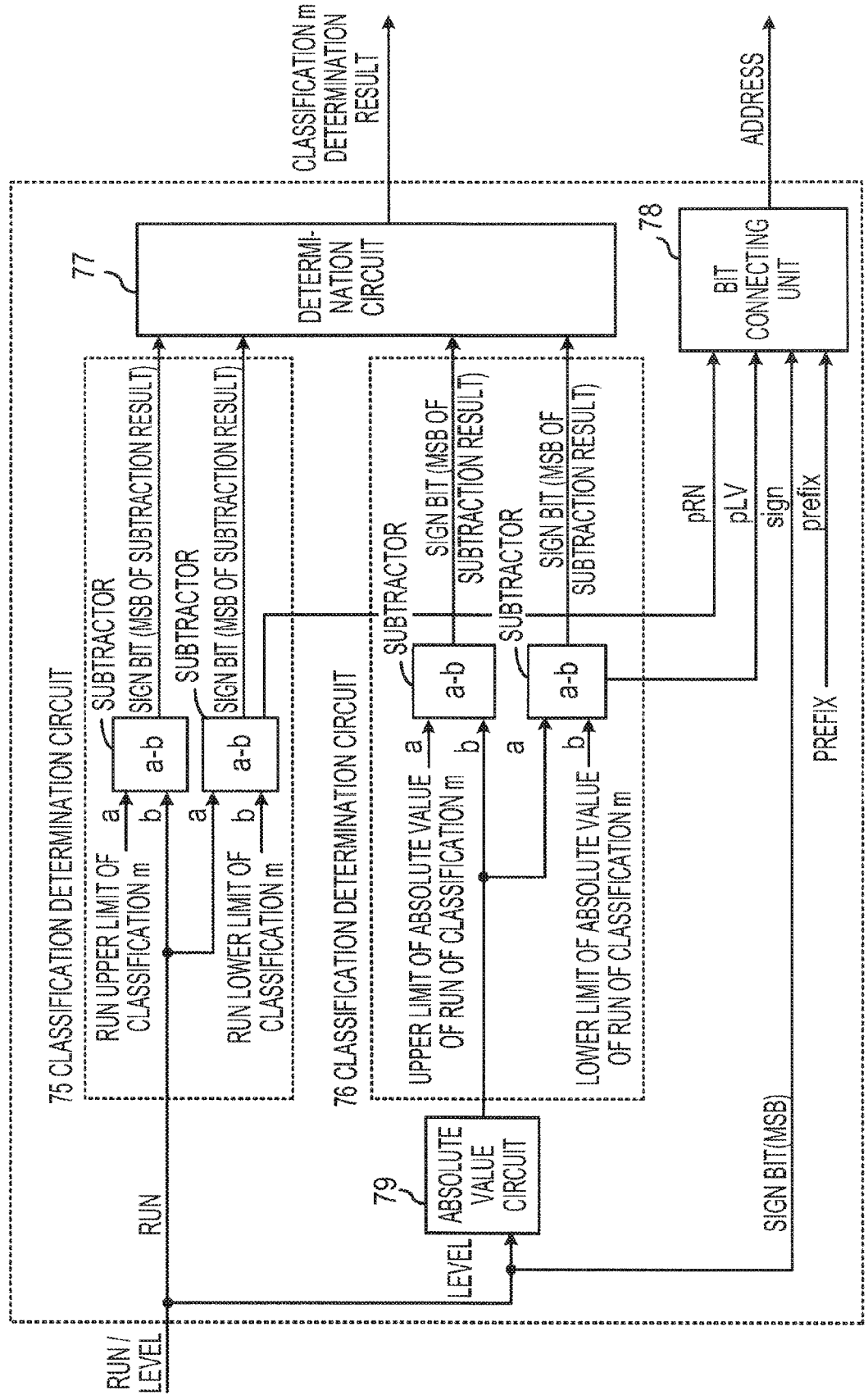
FIG. 19 illustrates exemplary classification m circuit.

FIG. 19 illustrates an exemplary classification m circuit of an address converter. The address converter may be the address converter of FIG. 18. For example, the address converter illustrated in FIG. 18 includes classification m circuits. The number of the classification circuits may be the number of classifications of the run-level sets. For example, the classification m circuit illustrated in FIG. 19 determines ((r_range_max≧run≧r_range_min)&& (l_range_max≧level absolute value≧l_range_min)). The circuits in other conditions may be analogized based on the classification m circuit illustrated in FIG. 19. For example, if the range of the run is the condition, the subtractors on the level side may be not necessary.

The sign bit of the subtraction result of a subtractor a−b indicates a magnitude relationship between a and b. Therefore, whether the run-level exists in the range of the condition or not is determined based on the sign bit of the subtraction result.

The run is input to a classification determination circuit 75. The code of the subtraction result indicating whether the input run exists between the upper limit and the lower limit of the run is acquired in the subtraction by the subtractor a−b, and the code is supplied to a determination circuit 77. An absolute value circuit 79 calculates the absolute value of the level and supplies the absolute value to a classification determination circuit 76. The subtractor a−b executes a subtraction and supplies the code of the subtraction result to the determination circuit 77. The subtraction result of the run, the subtraction result of the level, the code of the level, and the prefix are output to a bit connecting unit 78, and an address is output. The prefix is attached to address of classification m.

Figure 20:
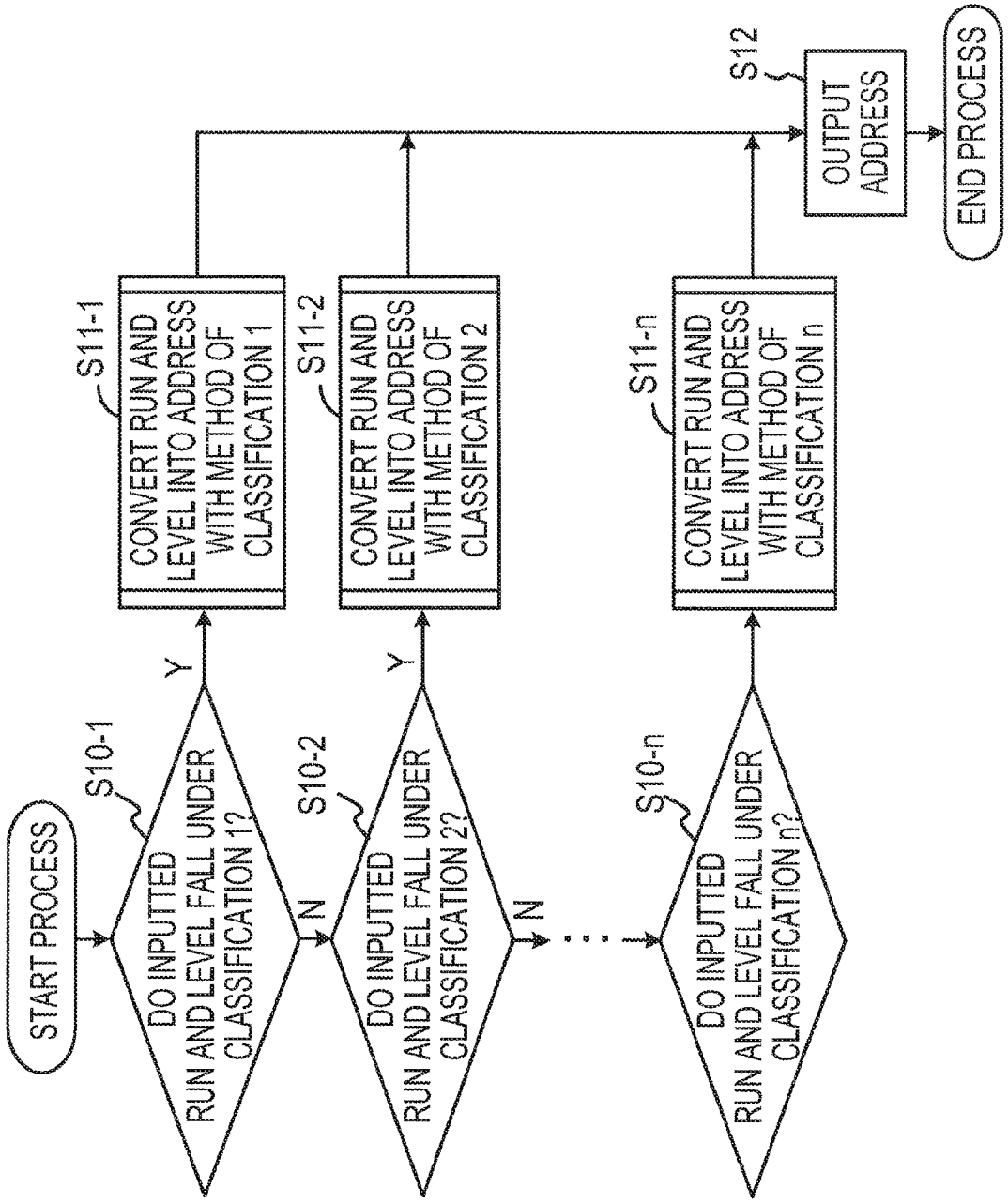
FIG. 20 illustrates an exemplary flow chart of a process of the address converter.

FIG. 20 illustrates an exemplary flow chart of a process of an address converter. In an operation S10-1, whether the input run and level belong to the classification 1 or not is determined. If the input run and level belong to the classification 1, the run and level are converted to an address with the method of the classification 1 in an operation S11-1, and the process proceeds to an operation S12. If the input run and level do not belong to the classification 1, whether the input run and level belong to the classification 2 or not is determined in an operation S10-2. If the input run and level belong to the classification 2, the run and level are converted to an address with the method of the classification 2 in an operation S11-2, and the process proceeds to the operation S12. If the input run and level do not belong to the classification 2, substantially the same process is performed up to the classification n. In an operation S10-n, whether the input run and level belong to the classification n or not is determined. In an operation S11-n, the run and level are converted to an address with the method of the classification n. The number n of operations is based on a number of classifications of run/level sets. In the operation S12, the address is output, and the process ends.

Figure 21:
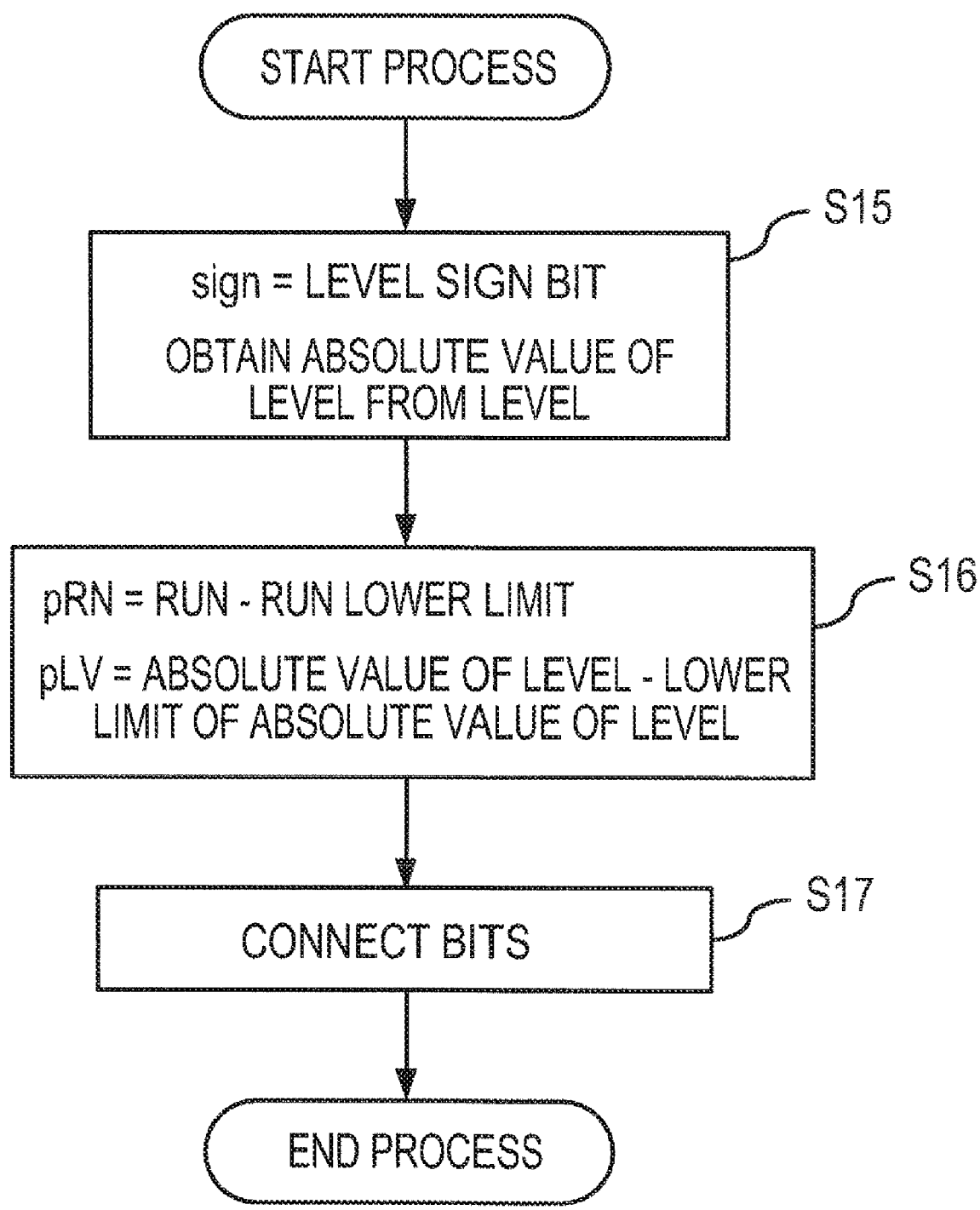
FIG. 21 illustrates an exemplary flow chart of an address conversion process.

FIG. 21 illustrates an exemplary flow chart of an address conversion process. The address conversion process may be the address conversion process shown in FIG. 20. In an operation S15, the sign bit of the level is set as sign, and the absolute value of the level is obtained. In an operation S16, the lower limit of the run is subtracted from the run to set the value as pRN. The lower limit of the absolute value of the level is subtracted from the absolute value of the level to set the value as pLV. In an operation S17, the bits are coupled, and the process ends.

Figure 22:
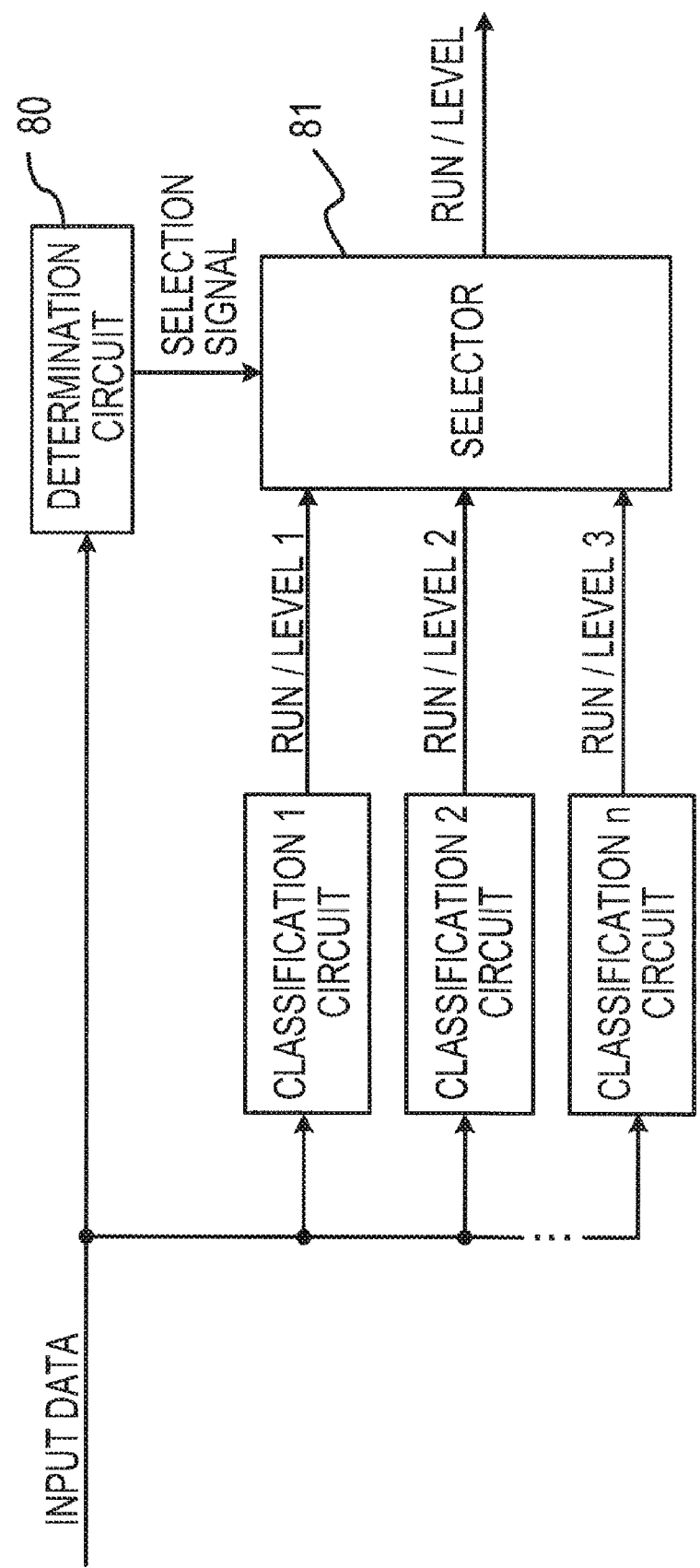
FIG. 22 illustrates an exemplary run-level decoder.

FIG. 22 illustrates an exemplary run-level decoder of an image decoder. The classification m circuit (m is an arbitrary integer from 1 to n) outputs a conversion result of a run-level from data in a certain classification. The number n of the classification m circuits is based on a number of classifications of run/level sets. A determination circuit 80 checks which classification the input data belongs to based on the bit part including the prefix in the input data. A selector 81 selects a run-level set based on the determination result of the determination circuit 80.

Figure 23:
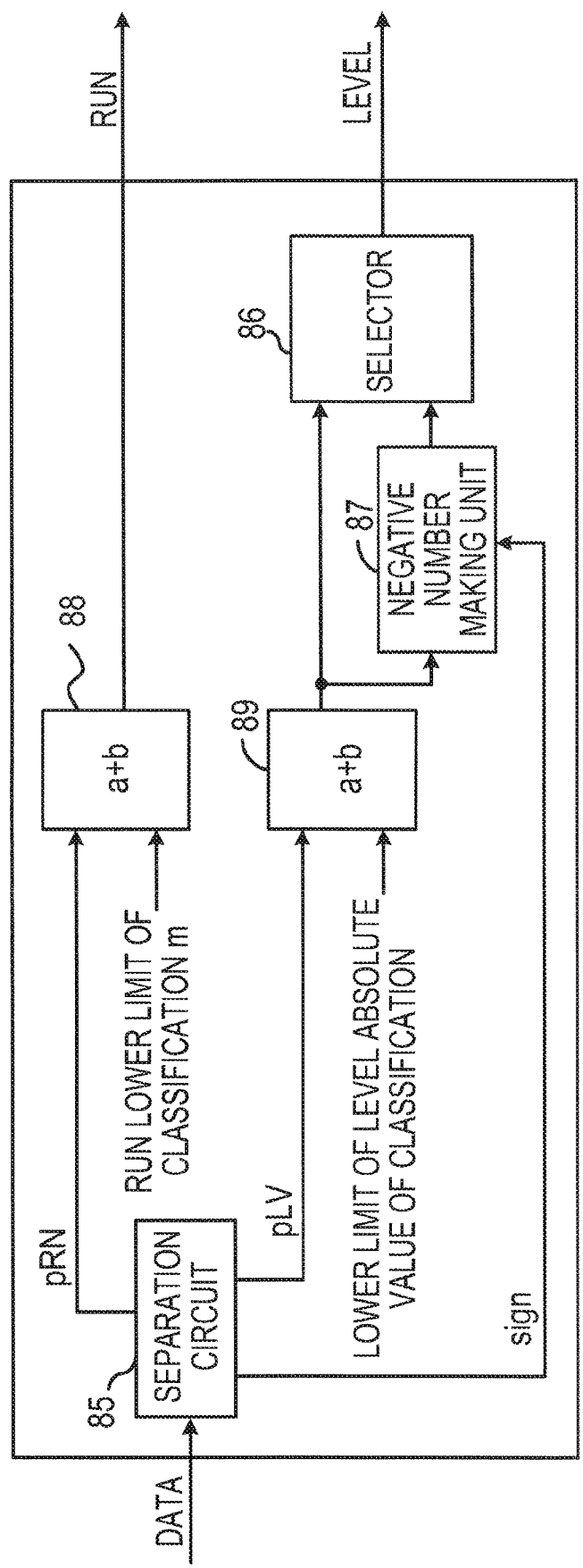
FIG. 23 illustrates an exemplary classification m circuit.

FIG. 23 illustrates an exemplary classification m circuit of a run-level decoder. The run-level decoder may be the run-level decoder of FIG. 22. Which parts of data are run part, level part, and sign part is determined in each classification. Therefore, a separation circuit 85 separates the input data into a run part, a level part, and a sign part. An adder 88 adds the run part and the lower limit of the run of the classification m and outputs the result as a run. An adder 89 adds the level part and the absolute value of the lower limit of the level of the classification m. A negative number making unit 87 makes the addition result negative. A selector 86 outputs either the addition result or the negative addition result as a level based on the separated sign part.

Figure 24:
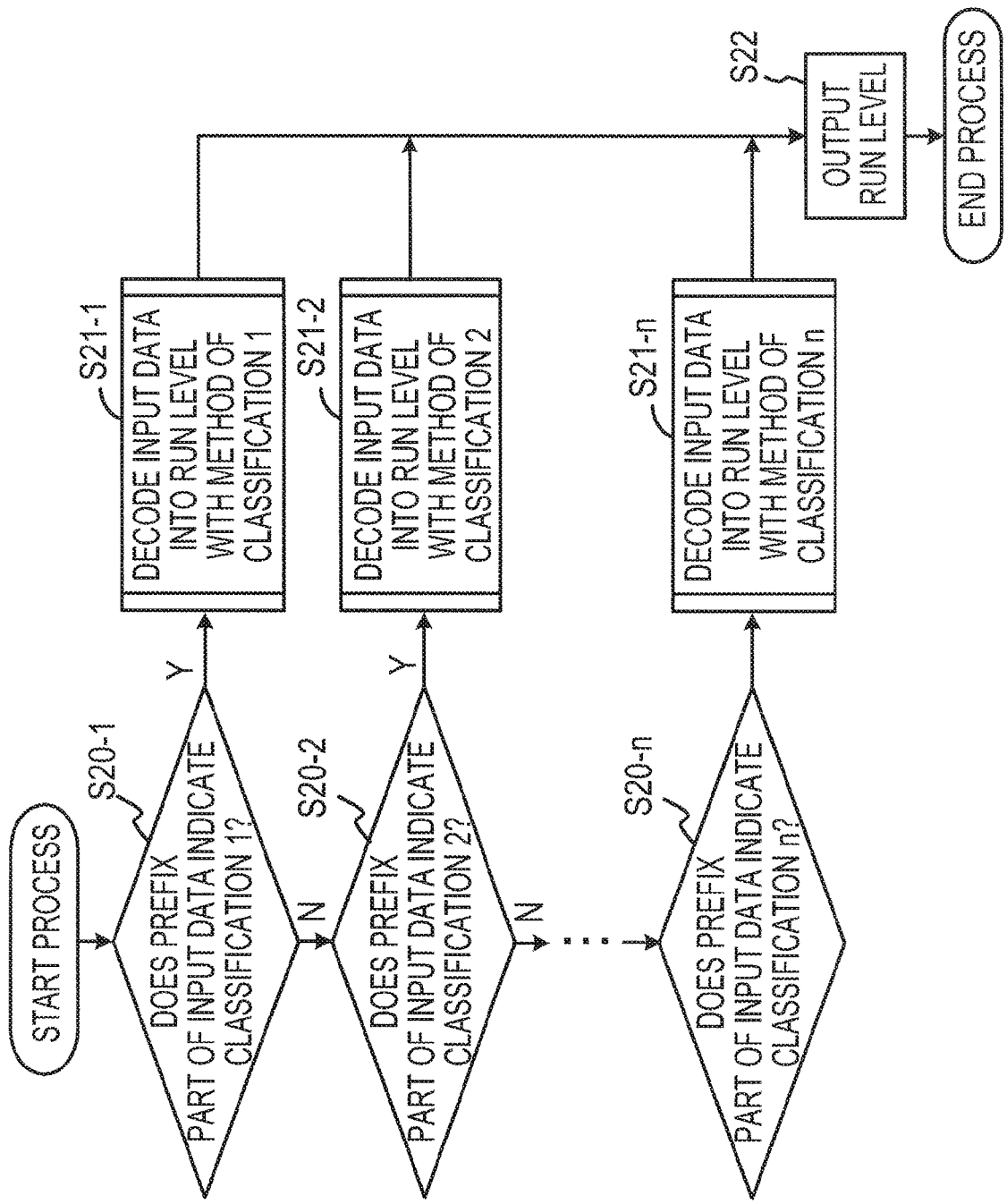
FIG. 24 illustrates an exemplary flow chart of a process of a run-level decoder.

FIG. 24 illustrates an exemplary flow chart of a process of the run-level decoder. In an operation S20-1, whether the prefix part of the input data belongs to the classification 1 is determined. If the prefix part belongs to the classification 1, the input data is decoded to a run level with the method of the classification 1 in an operation S21-1, and the process proceeds to an operation S22. If the prefix part does not belong to the classification 1, whether the prefix part of the input data belongs to the classification 2 is determined in an operation S20-2. If the prefix part belongs to the classification 2, the input data is decoded to a run level with the method of the classification 2 in an operation S21-2, and the process proceeds to an operation S22. If the prefix part does not belong to the classification 2, the same process is executed up to the classification n. In an operation S20-n, whether the prefix part of the input data belongs to the classification n is determined. In an operation S21-n, the input data is decoded to a run level with the method of the classification n. The number n of operations is based on a number of classifications of run/level sets. The run-level is output in an operation S22.

Figure 25:
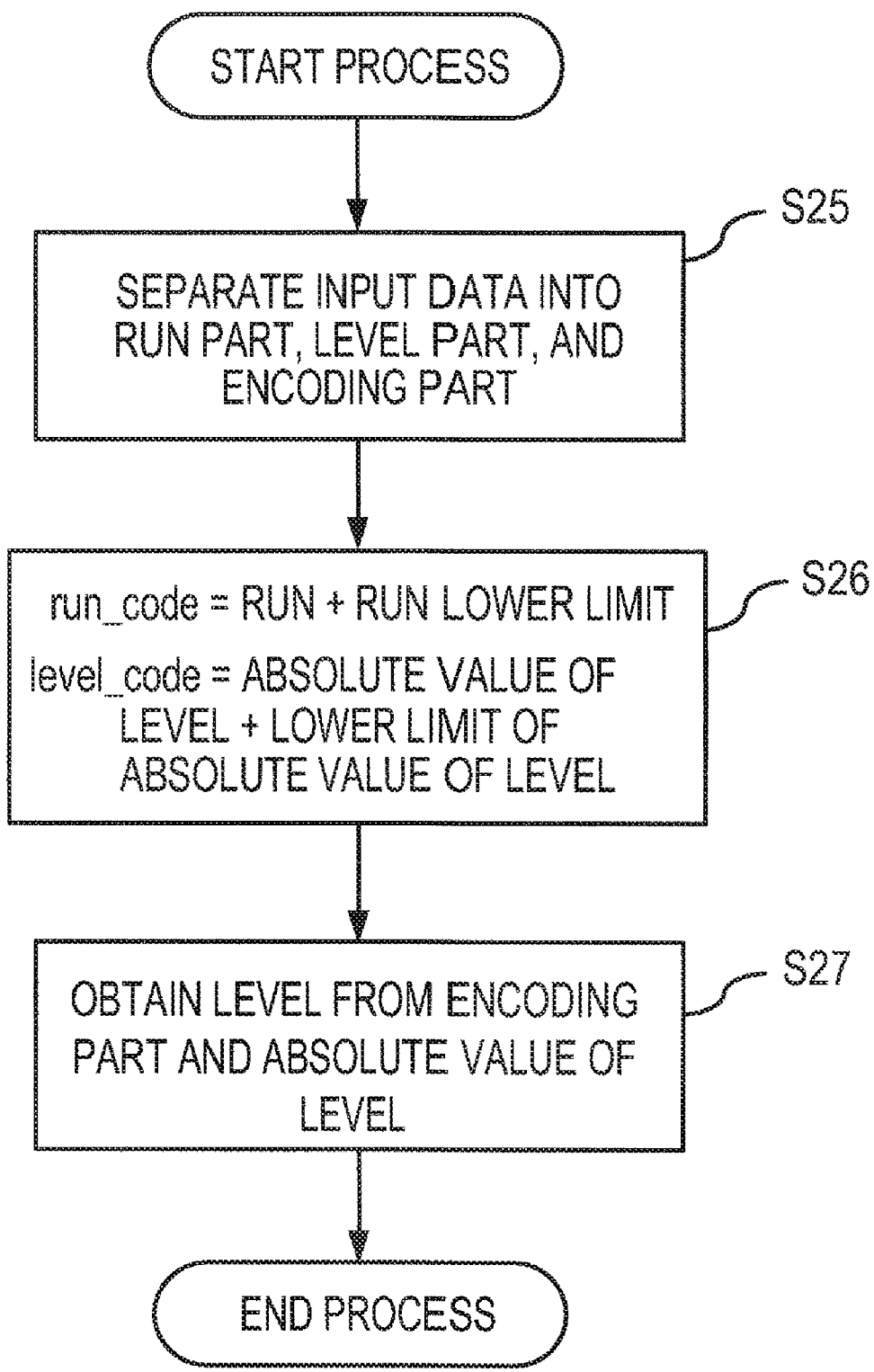
FIG. 25 illustrates an exemplary flow chart of a run-level decoding process.

FIG. 25 illustrates an exemplary flow chart of a run-level decoding process. The run-level decoding process may be the run-level decoding process of FIG. 24. In an operation S25, the input data is separated into a run part, a level part, and a sign part. In an operation S26, the run and the lower limit of the run are added to set run_code, and the absolute value of the level and the lower limit of the absolute value of the level are added to set level_code. In an operation S27, the level is obtained based on the sign part and the absolute value of the level, and the process ends.

Example embodiments of the present invention have now been described in accordance with the above advantages. It will be appreciated that these examples are merely illustrative of the invention. Many variations and modifications will be apparent to those skilled in the art.

The invention claimed is:

1. A variable length decoder that decodes a variable length code to output data including at least a run and a level, the variable length decoder comprising:
   a memory that stores an output format of the run and the level according to a prefix for specifying an area which is generated by dividing a run-level plane based on the run;
   an extraction circuit that extracts the prefix, run computation data, and level computation data from an output of the memory; and
   an output circuit that outputs the run and the level based on the run computation data and the level computation data,
   wherein, when a maximum value of the area corresponding to the prefix is m and a minimum value of the area corresponding to the prefix is n, the level computation data includes a minimum bit number (level-n) for indicating (m−n) areas.

2. The variable length decoder according to claim 1, wherein the area is obtained by dividing a run value and a level value in a run direction and a level direction, respectively.

3. A variable length decoder that decodes a variable length code to output data including at least a run and a level, the variable length decoder comprising:
   a memory that stores an output format of the run, the level and prefix for specifying an area which is generated by dividing a run-level plane based on the run,
   an extraction circuit that extracts the prefix, run computation data, and level computation data from an output of the memory; and
   an output circuit that outputs the run and the level based on the run computation data and the level computation data,
   wherein, when the maximum value of the area corresponding to the prefix is m and the minimum value of the area corresponding to the prefix, the run computation data includes a minimum bit number (run-n) for indicating (m−n) areas.

4. The variable length decoder according to claim 1, wherein the extraction circuit extracts data indicating a sign of the level from the variable length code.

5. A variable length encoder that encodes data including a run and a level to output a variable length code, the variable length encoder comprising:
   a memory that stores an output format of a bit string according to a prefix for specifying an area which is generated by dividing a run-level plane based on the run, a bit string of an encoded run, and a bit string of an encoded level; and
   an output circuit that outputs a bit string obtained by coupling the bit string of the prefix, the bit string of the encoded run, and the bit string of the encoded level,
   wherein, when a maximum value of the area corresponding to the prefix is m and a minimum value of the area corresponding to the prefix is n, the bit string of the encoded level includes a minimum bit number (level-n) for indicating (m−n) areas.

6. The variable length encoder according to claim 5, wherein the area is obtained by dividing a run value and a level value in a run direction and a level direction, respectively.

7. A variable length encoder that encodes data including a run and a level to output a variable length code, the variable length encoder comprising:
- a memory that stores an output format of a bit string according to a prefix for specifying an area which is generated by dividing a run-level plane based on the run, a bit string of an encoded run, and a bit string of an encoded level; and
- an output circuit outputs a bit string obtained by coupling the bit string of the prefix, the bit string of the encoded run, and the bit string of the encoded level,
- wherein, when a maximum value of the area corresponding to the prefix is m and a minimum value of the area corresponding to the prefix is n, the bit string of the encoded run includes a minimum bit number (run-n) for indicating (m−n) areas.

8. The variable length encoder according to claim 5, wherein the output circuit outputs a bit string indicating an absolute value of the level and a bit string indicating a sign of the level.

9. A variable length decoding method of decoding a variable length code to output data including a run and a level, the variable length decoding method comprising:
- dividing a run-level plane based on a run value;
- storing an output format of the run, the level and a prefix specifying a divided area to a memory;
- extracting the prefix, run computation data, and level computation data from a an output of the memory and
- outputting the run and the level based on the run computation data and the level computation data,
- wherein, when the maximum value of the area corresponding to the prefix is m and the minimum value of the area corresponding to the prefix is n, the level computation data includes a minimum bit number (level-n) for indicating (m−n) divided areas.

10. The variable length decoding method according to claim 9, wherein the area is generated by dividing the run and the level in a run direction and a level direction, respectively.

11. A variable length decoding method of decoding a variable length code to output data including a run and a level, the variable length decoding method comprising:
- dividing a run-level plane based on a run value;
- storing an output format of the run, the level and prefix specifying a divided area to a memory;
- extracting the prefix, run computation data, and level computation data from output of the memory; and
- outputting the run and the level based on the run computation data and the level computation data,
- wherein, when the maximum value of the area corresponding to the prefix is m and the minimum value is n, the run computation data includes a minimum bit (run-n) for indicating (m−n) divided areas.

12. The variable length decoding method according to claim 9, wherein data indicating a sign of the level is extracted from the variable length code.

13. The variable length decoder according to claim 3, wherein the extraction circuit extracts data indicating a sign of the level from the variable length code.

14. The variable length encoder according to claim 7, wherein the output circuit outputs a bit string indicating an absolute value of the level and a bit string indicating a sign of the level.

15. The variable length decoding method according to claim 11, wherein data indicating a sign of the level is extracted from the variable length code.

* * * * *